(12) United States Patent
Hu et al.

(10) Patent No.: US 6,767,847 B1
(45) Date of Patent: Jul. 27, 2004

(54) METHOD OF FORMING A SILICON NITRIDE-SILICON DIOXIDE GATE STACK

(75) Inventors: Chien-Ming Hu, Hsin-Chu (TW);
Chien-Hao Chen, Ilan (TW);
Mo-Chiun Yu, Taipei (TW);
Shih-Chang Chen, Taoyuan (TW);
Mong-Song Liang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/187,704

(22) Filed: Jul. 2, 2002

(51) Int. Cl.$^7$ ............................................. H01L 21/324
(52) U.S. Cl. ........................ 438/771; 438/216; 438/217; 438/261; 438/287; 438/289; 438/308; 438/762; 763/766; 763/771
(58) Field of Search ............................... 438/216, 217, 438/261, 287, 289, 308, 762, 763, 766, 771, 772

(56) References Cited

U.S. PATENT DOCUMENTS

| | | | |
|---|---|---|---|
| 5,962,904 A | 10/1999 | Hu | 257/412 |
| 5,972,804 A | 10/1999 | Tobin et al. | 438/786 |
| 6,096,640 A | 8/2000 | Hu | 438/652 |
| 6,140,187 A | 10/2000 | DeBusk et al. | 438/287 |
| 6,197,701 B1 * | 3/2001 | Shue et al. | 438/763 |
| 6,204,125 B1 | 3/2001 | Lee et al. | 438/264 |
| 6,248,618 B1 * | 6/2001 | Quek et al. | 438/199 |
| 6,458,717 B1 * | 10/2002 | Lee et al. | 438/778 |
| 2003/0052377 A1 * | 3/2003 | Weimer | 257/411 |

OTHER PUBLICATIONS

Wolf et al., Silicon Processing for the VLSI Era, vol. 1: Process Technology, 1986, Lattice Press, p. 194.*

* cited by examiner

Primary Examiner—George Fourson
Assistant Examiner—Julio J. Maldonado
(74) Attorney, Agent, or Firm—George O. Saile; Stephen B. Ackerman

(57) ABSTRACT

A method of forming a silicon nitride-silicon dioxide composite insulator layer for use as a gate insulator stack for an MOSFET device, has been developed. The method features formation of the silicon dioxide component of the gate insulator stack, after formation of the overlying silicon nitride component, allowing the gate insulator stack to be comprised with a nitrogen profile presenting enhanced barrier characteristic and less interface charge than counterpart silicon nitride-silicon dioxide composites formed wherein the silicon nitride component was deposited on an already grown underlying silicon dioxide layer. Oxygen ions, or oxygen radicals obtained via ultra-violet procedures, penetrate the silicon nitride component and locate in a top portion of the semiconductor substrate. Subsequent annealing allows reaction of the oxygen ions or radicals with a top portion of the semiconductor substrate resulting in the desired silicon dioxide component underlying silicon nitride.

15 Claims, 2 Drawing Sheets

METHOD OF FORMING A SILICON NITRIDE-SILICON DIOXIDE GATE STACK

BACKGROUND OF THE INVENTION (1) Field of the Invention

The present invention relates to methods of fabricating semiconductor devices, and more specifically to a method used to form a silicon nitride-silicon dioxide composite layer for use as the gate dielectric material.

(2) Description of Prior Art

Reduction in gate dielectric layer thickness has allowed the performance of metal oxide semiconductor field effect transistor (MOSFET), to be increased, while device operating voltages have been reduced. However the continuing down scaling of silicon dioxide gate insulator thickness can present yield and reliability concerns for ultra-thin, less than 20 Angstroms, silicon dioxide layers. The use of a composite dielectric layer such as a silicon nitride-silicon dioxide stack, reduces the yield and reliability concerns encountered with thinner silicon dioxide gate layers, while the higher dielectric constant of silicon nitride component allows a thicker gate insulator stack to be used. In addition the equivalent oxide thickness (EOT), of the silicon nitride-silicon dioxide composite can be comparable to thinner silicon dioxide counterparts, thus preserving the performance objective previously satisfied by thinner silicon dioxide layers, therefore the silicon nitride-silicon dioxide stack, has emerged as a attractive gate replacement for thin silicon dioxide gate layers.

One method of forming the silicon nitride-silicon dioxide stack is to first thermally grow the silicon dioxide component followed by deposition of the overlying silicon nitride layer. However this method can result in unwanted trapped charge at the silicon nitride-silicon dioxide interface, as well as fixed charge generated as a result of the overlying silicon nitride layer, at the silicon dioxide-semiconductor interface. The generation of these charges is the undesired shifts of flatband voltage, and thus erratic threshold voltages.

The present invention will describe methods of forming silicon nitride-silicon dioxide gate stacks wherein the silicon nitride component is first formed followed by formation of the underlying silicon dioxide component. This process sequence results in an improved nitrogen profile in the composite gate stack, as well as a reduction in nitrogen pile up at the silicon dioxide-silicon semiconductor interface, thus resulting in superior device performance when compared to counterparts formed via deposition and anneal of a silicon nitride layer on an already grown silicon dioxide layer. Prior art, such as Tobin et al, in U.S. Pat. No. 5,972,804, Debusk et al, in U.S. Pat. No. 6,140,187, Hu, in U.S. Pat. No. 5,962,904, Hu, in U.S. Pat. No. 6,096,640, and Lee et al, in U.S. Pat. No. 6,204,125 B1, describe methods for forming gate, as well as composite gate insulator layers. None of the above prior arts however describe the novel procedures described in the present invention, in which a composite silicon nitride-silicon dioxide gate insulator stack is formed featuring formation of the underlying silicon dioxide component after deposition of the overlying silicon nitride layer.

SUMMARY OF THE INVENTION

It is an object of this invention to form a silicon nitride-silicon dioxide stack for use as a MOSFET gate insulator layer.

It is another object of this invention to initially deposit a silicon nitride layer prior to formation of the underlying silicon dioxide component of the silicon nitride-silicon dioxide, gate insulator stack.

It is still another object of this invention to form the silicon dioxide component of the silicon nitride-silicon dioxide gate insulator stack, via implantation of oxygen ions through the silicon nitride layer into a top portion of the semiconductor substrate, followed by an anneal procedure used to activate the oxygen ions and to form a silicon dioxide layer underlying the silicon nitride layer.

It is still yet another object of this invention to form the silicon dioxide component of the silicon nitride-silicon dioxide gate insulator stack, via ultra-violet generation of oxygen radicals which penetrate through the silicon nitride layer into a top portion of the semiconductor substrate, followed by an anneal procedure used to activate the oxygen radicals, forming a silicon dioxide layer underlying the silicon nitride layer.

In accordance with the present invention methods of forming a silicon nitride-silicon dioxide gate insulator stack, wherein the silicon dioxide component of the gate insulator stack is formed after deposition of the overlying silicon nitride layer, is described. A first embodiment of this invention initiates with the formation of a silicon nitride layer, via chemical vapor deposition (CVD), or via plasma nitridization procedures. An optional anneal cycle employed for densification purposed, can be performed if desired. Implantation of oxygen ions through the silicon nitride layer and into a top portion of the semiconductor substrate, is followed by an anneal procedure used to activate the oxygen ions and to form a silicon dioxide layer located underlying the silicon nitride layer of the silicon nitride-silicon dioxide gate insulator stack.

A second embodiment of this invention again initiates with the formation of a silicon nitride layer, via chemical vapor deposition (CVD), or via plasma nitridization procedures. An optional anneal cycle, employed for densification purposed, can be performed if desired. The silicon nitride layer is then exposed to an ultra violet procedure performed to generate oxygen radicals, and to allow the oxygen radicals to penetrate the silicon nitride layer to react with a top portion of the semiconductor substrate to form a silicon dioxide layer. An anneal procedure is next performed to finalize the oxidation procedure, resulting in a silicon dioxide layer formed using ultra-violet generated oxygen, again located underlying the silicon nitride layer of the silicon nitride-silicon dioxide gate insulator stack.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
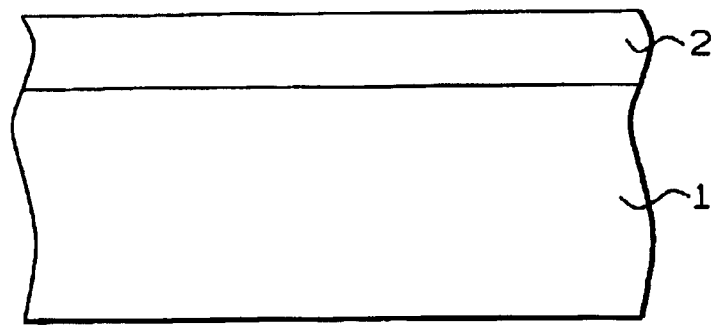
FIGS. 1–3, which schematically, in cross-sectional style describe key fabrication stages of a first embodiment of this invention, used to form a silicon nitride-silicon dioxide gate insulator stack.

The method of forming a silicon nitride-silicon dioxide gate insulator stack for a MOSFET device, wherein the silicon dioxide component of the gate insulator stack is formed after formation of the silicon nitride component of the same gate insulator stack, will now be described in detail. Semiconductor substrate 1, comprised of P type, single crystalline silicon with a <100> crystallographic orientation, is used and schematically shown in FIG. 1. Silicon nitride layer 2, is next formed on the surface of semiconductor substrate 1, at a thickness between about 10 to 20 Angstroms. Silicon nitride layer 2, can be obtained via low pressure chemical vapor deposition (LPCVD), or plasma enhance chemical vapor deposition (PECVD), procedures, using silane and ammonia as reactants. If desired silicon nitride layer 2, can also be obtained via plasma nitridization procedures, at an RF power between about 100 to 1000 watts, at a pressure between about 0.1 to 10 torr, in an ammonia ambient. If desired an anneal procedure, used to densify silicon nitride layer 2, can be performed at a temperature between about 900 to 1200° C., for a time between about 0.1 to 3 min, in an ambient comprised with nitrogen, $N_2O$, NO, argon and oxygen. The result of the above procedures is schematically shown in FIG. 1.

Figure 2:
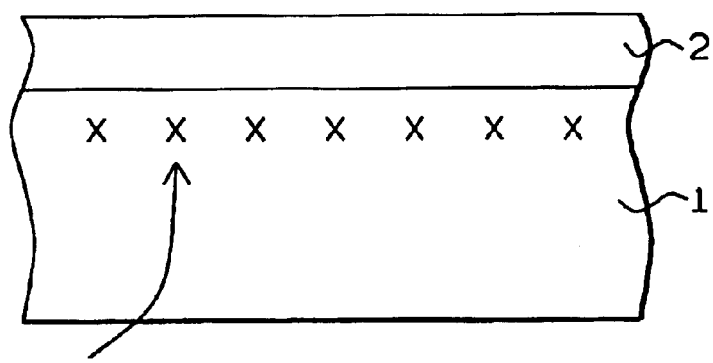
Figure 3:
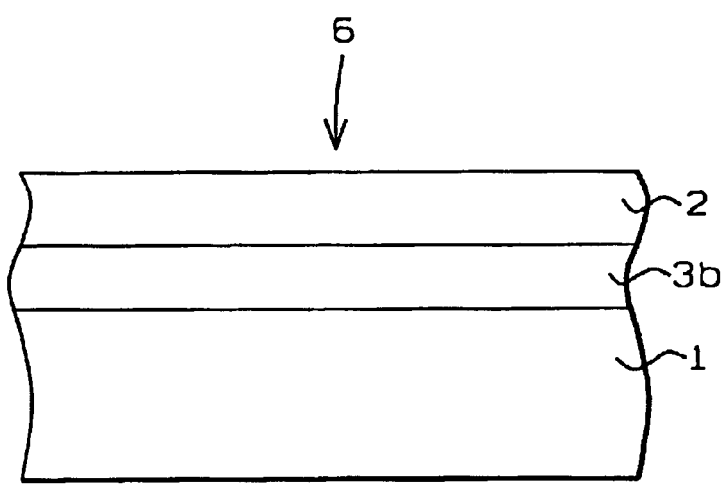

A first embodiment of this invention, the formation of a silicon dioxide layer via implantation of oxygen ions is next described. An implantation procedure is used to place oxygen ions 3b, into a top portion of semiconductor substrate 1. This is accomplished at an implant energy between about 10 to 100 KeV, and at a dose between about 1E14 to 1E15 atoms/$cm^2$. The result of the oxygen implantation procedure is schematically shown in FIG. 2. An anneal procedure, performed at a temperature between about 900 to 1200° C., for a time between about 0.1 to 3 min, in an ambient comprised of nitrogen, $N_2O$, NO, argon and oxygen, is used to activate oxygen ions 3a, forming silicon dioxide layer 3b, and resulting in the desired, silicon nitride-silicon dioxide gate insulator stack 6, shown schematically in FIG. 3. Silicon dioxide layer 3b, is formed at a thickness between about 5 to 10 Angstroms. The nitrogen profile in gate insulator stack 6, features a high nitrogen concentration at the top surface of the stack, offering protection of the underlying silicon dioxide layer from boron penetration which can occur during heavily doped P type source/drain procedures used for P channel, or PMOS devices. In addition a low nitrogen profile is present at the silicon dioxide-semiconductor interface, thus reducing charge generation or unwanted nitrogen pile up at this interface.

Figure 4:
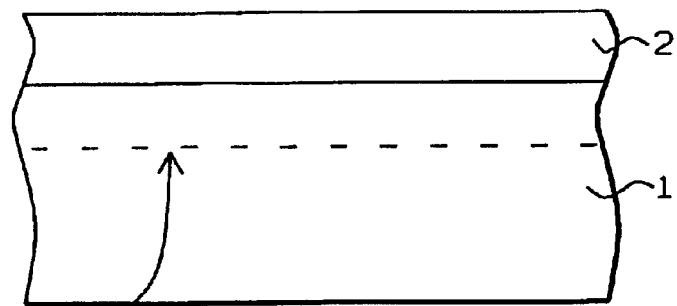
FIGS. 4–6, which schematically, in cross-sectional style describe key fabrication stages of a second embodiment of this invention, used to form a MOSFET device featuring a silicon nitride-silicon dioxide gate insulator stack.

A second embodiment of this invention, again employs the formation of a silicon nitride-silicon dioxide gate insulator stack, featuring creation of silicon dioxide layer after formation of the overlying silicon nitride layer, however for this embodiment the silicon dioxide component is formed from oxygen radicals placed in a top portion of the semiconductor substrate via ultra-violet procedures. Silicon nitride layer 2, is again obtained at a thickness between about 10 to 20 Angstroms, via either LPCVD, PECVD or plasma nitridization procedures, using conditions identical to the conditions described for silicon nitride formation in the first embodiment of the invention. An optional anneal procedure can then be performed using the identical process conditions, time, temperature and ambient of the anneal, previously describe for the optional, post-silicon nitride formation procedure, in the first embodiment. An ultra violet (UV) procedure, performed at an energy between about 0.1 to 1000 watts/$cm^2$, at a wavelength between about 100 to 200 nm, in an oxygen ambient, is used to generate oxygen radicals 4a. The conditions used for the UV procedure allow oxygen radicals 4a, to penetrate silicon nitride layer 2, resulting in oxygen radicals 4a, located in a top portion of semiconductor substrate 1. This is schematically shown in FIG. 4.

Figure 5:
Figure 5:
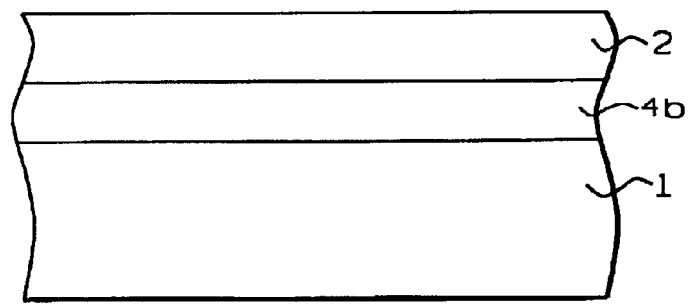

An anneal procedure is next performed to allow oxygen radicals 4a, to react with surrounding silicon from semiconductor substrate 1, resulting in the formation of silicon dioxide layer 4b, at a thickness between about 5 to 10 Angstroms. The anneal procedure is performed at a temperature between about 900 to 1200° C., for a time between about 0.1 to 3 min, in an ambient comprised of nitrogen, $N_2O$, NO, argon and oxygen. The resulting silicon nitride silicon dioxide gate insulator stack, shown schematically in FIG. 5, again features a nitrogen profile with a high nitrogen concentration at the top surface of the stack, offering protection of the underlying silicon dioxide layer from boron penetration which can occur during heavily doped P type source/drain procedures used for P channel, or PMOS devices. In addition a low nitrogen profile is present at the silicon dioxide-semiconductor interface, thus reducing charge generation or unwanted nitrogen pile up at this interface. The ability to form a gate insulator stack with this nitrogen profile results in improved device parametrics and yield when compared to counterpart devices formed with gate insulator stacks which do not feature high nitrogen content at the top of the stack, and a low nitrogen content at the silicon dioxide-semiconductor interface.

Figure 6:
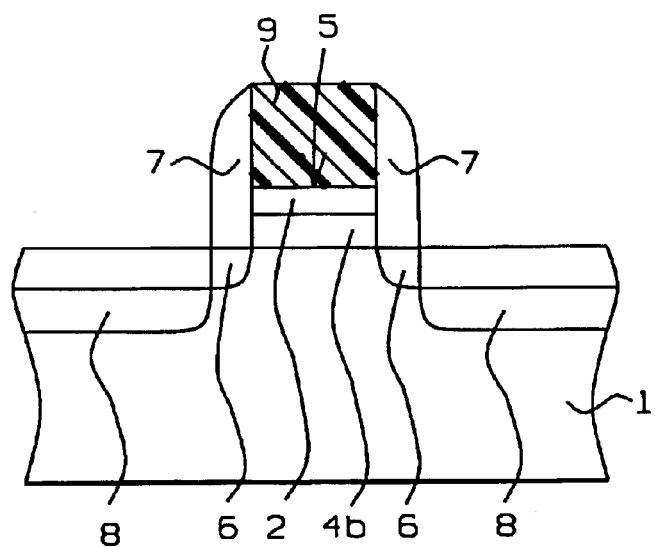

Fabrication of a MOSFET device, formed using the silicon nitride-silicon dioxide gate insulator stack, is next described and shown schematically in FIG. 6. First a conductive layer such as doped polysilicon or metal silicide, is deposited via chemical vapor deposition procedures. A photoresist shape, not shown in the drawings, is used as a mask to allow a dry etch procedure to define conductive gate structure 9, on silicon nitride-silicon dioxide gate insulator stack 5. The dry etch procedure is performed using $Cl_2$ as an etchant for the conductive layer and for silicon nitride layer 2, while a post-photoresist clean procedure, using a buffered hydrofluoric acid solution, removes exposed regions of silicon oxide layer 4b. If a boron doped, polysilicon layer were used for conductive structure 9, boron penetration to silicon dioxide layer 4b, would be prevented via the high nitrogen region located near the top of silicon nitride layer 2. Lightly doped source/drain region 6, is next formed in regions of semiconductor substrate 1, not covered by conductive gate structure 9, via implantation of either N type or P type ions. An insulator layer such as silicon oxide or silicon nitride is next deposited followed by an anisotropic dry etch procedure, using either $CHF_3$ or $Cl_2$ as an etchant, resulting in insulator spacers 7, located on the sides of conductive gate structure 9. Heavily doped source/drain region 8, is then formed in a portion of semiconductor substrate 1, not covered by conductive gate structure 9, or by insulator spacers 8, via implantation of N type ions if an NMOS device is desired, or via implantation of P type ions if a PMOS device is desired. An anneal procedure can now be performed to activate the implanted ions in lightly doped source/drain region 6, and in heavily doped source/drain region 8.

While this invention has been particularly shown and described with reference to the preferred embodiments thereof, it will be understood by those skilled in the art that various changes in form and details may be made without departing from the spirit or scope of the invention.

What is claimed is:

1. A method of forming a gate insulator stack on a semiconductor substrate, comprising the steps of:

forming a first insulator layer on said semiconductor substrate;

placing energized oxygen radical in a top portion of said semiconductor substrate, with oxygen radicals obtained via ultra-violet procedures performed in an oxygen ambient, at an energy between about 0.1 to 1000 watts/cm$^2$, at a wavelength between about 100 to 300 nm; and performing an anneal procedure to form a second insulator layer via reaction of said energized species and said semiconductor substrate, resulting in said gate insulator stack comprised of said first insulator layer overlying said second insulator layer.

2. The method of claim 1, wherein said first insulator layer is a silicon nitride layer at a thickness between about 10 to 20 Angstroms.

3. The method of claim 1, wherein said first insulator layer is a silicon nitride layer obtained via LPCVD or PECVD procedures.

4. The method of claim 1, wherein said first insulator layer is a silicon nitride layer obtained via plasma nitridization, performed at a power between about 100 to 1000 watts, at a pressure between about 0.1 to 10 torr, in an ammonia ambient.

5. The method of claim 1, further comprising an optional anneal procedure performed to said first insulator layer, at a temperature between about 900 to 1200° C., for a tome between about 0.1 to 3 min, in an ambient comprised of nitrogen, N$_2$O, NO, argon and oxygen.

6. The method of claim 1, wherein said anneal procedure is performed at a temperature between about 900 to 1200° C., for a time between about 0.1 to 3 min, in an ambient comprised with nitrogen, N$_2$O, NO, argon and oxygen.

7. The method of claim 1, wherein said second insulator layer is a silicon dioxide layer formed at a thickness between about 5 to 10 Angstroms.

8. A method of forming a silicon nitride-silicon dioxide gate insulator stack on a semiconductor substrate, comprising the steps of:

forming a silicon nitride layer on said semiconductor substrate;

performing a first anneal procedure;

performing an ultra-violet procedure to form oxygen radicals, and place said oxygen radicals in a top portion of said semiconductor substrate; and performing a second anneal procedure to form a silicon dioxide layer via reaction of said oxygen radicals and said semiconductor substrate, resulting in said silicon nitride-silicon dioxide gate insulator stack.

9. The method of claim 8, wherein said silicon nitride layer is obtained via LPCVD or PECVD procedures.

10. The method of claim 8, wherein said silicon nitride layer is obtained via plasma nitridization, performed at a power between about 100 to 1000 watts, at a pressure between about 0.1 to 10 torr, in an ammonia ambient.

11. The method of claim 8, wherein said silicon nitride layer is obtained at a thickness between about 10 to 20 Angstroms.

12. The method of claim 8, wherein said first anneal procedure is performed at a temperature between about 900 to 1200° C., for a time between about 0.1 to 3 min, in an ambient comprised of nitrogen, N$_2$O, NO, argon and oxygen.

13. The method of claim 8, wherein said ultra-violet procedure is performed in an oxygen ambient, at an energy between about 0.1 to 1000 watts/cm$^2$, at a wavelength between about 100 to 300 nm.

14. The method of claim 8, wherein said second anneal procedure is performed at a temperature between about 900 to 1200° C., for a time between about 0.1 to 3 min, in an ambient comprised with nitrogen, N$_2$O, NO, argon and oxygen.

15. The method of claim 8, wherein said silicon dioxide layer is obtained at a thickness between about 5 to 10 Angstroms.

* * * * *